(12) United States Patent
Shiraishi et al.

(10) Patent No.: US 8,564,077 B2
(45) Date of Patent: Oct. 22, 2013

(54) PACKAGE FOR ELECTRONIC COMPONENT, MANUFACTURING METHOD THEREOF AND SENSING APPARATUS

(75) Inventors: Akinori Shiraishi, Nagano (JP);
Masahiro Sunohara, Nagano (JP);
Hideaki Sakaguchi, Nagano (JP);
Yuichi Taguchi, Nagano (JP);
Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/643,391

(22) Filed: Dec. 21, 2009

(65) Prior Publication Data

US 2010/0155862 A1    Jun. 24, 2010

(30) Foreign Application Priority Data

Dec. 24, 2008  (JP) ............................. P.2008-328343
Oct. 19, 2009  (JP) ............................. P.2009-240077

(51) Int. Cl.
*H01L 29/84* (2006.01)
*H01L 23/52* (2006.01)
*H01L 21/50* (2006.01)

(52) U.S. Cl.
USPC ............ 257/415; 257/E23.141; 257/E21.499; 257/E29.234

(58) Field of Classification Search
USPC .................. 257/415, 690, E23.141, E21.499, 257/E29.324
See application file for complete search history.

(56) References Cited

U.S. PATENT DOCUMENTS 6,040,621 A * 3/2000 Nose .............................. 257/666
6,235,551 B1 * 5/2001 Farnworth et al. ............ 438/106

FOREIGN PATENT DOCUMENTS

| JP | A-S55-145359 | 11/1980 |
| JP | A-H9-051199 | 2/1997 |
| JP | A-H10-321874 | 12/1998 |
| JP | A-2005-044966 | 2/2005 |
| JP | 2007-132687 | 5/2007 |

* cited by examiner

*Primary Examiner* — Matthew W Such
*Assistant Examiner* — Monica D Harrison
(74) *Attorney, Agent, or Firm* — Drinker Biddle & Reath LLP (57) ABSTRACT

A package for electronic component comprises a rectangular package body having a flat cut surface to be abutted on a flat mounting surface of a mounting substrate, a first side surface intersecting with the flat cut surface, and a first notch part formed at a boundary between the flat cut surface and the first side surface, an electronic component installed in the package body, and a first pad electrically connected to the electronic component and formed on an inner wall surface of the first notch part.

23 Claims, 10 Drawing Sheets

PACKAGE FOR ELECTRONIC COMPONENT, MANUFACTURING METHOD THEREOF AND SENSING APPARATUS

This application claims priority to Japanese Patent Application No. 2008-328343, filed Dec. 24, 2008, in the Japanese Patent Office and Japanese Patent Application No. 2009-240077, filed Oct. 19, 2009, in the Japanese Patent Office. The Japanese Patent Application No. 2008-328343 and the Japanese Patent Application No. 2009-240077 is incorporated by reference in its entirety.

TECHNICAL FIELD

The present disclosure relates to a package for electronic component, a manufacturing method thereof and a sensing apparatus.

RELATED ART

A package for electronic component in which a package in which an electronic component such as a sensing element for sensing acceleration etc. is installed is mounted in a state in which an end face of the package abuts perpendicularly on a mounting surface of the mounting substrate is described in, for example, the following. Patent Reference 1.

Figure 10A:
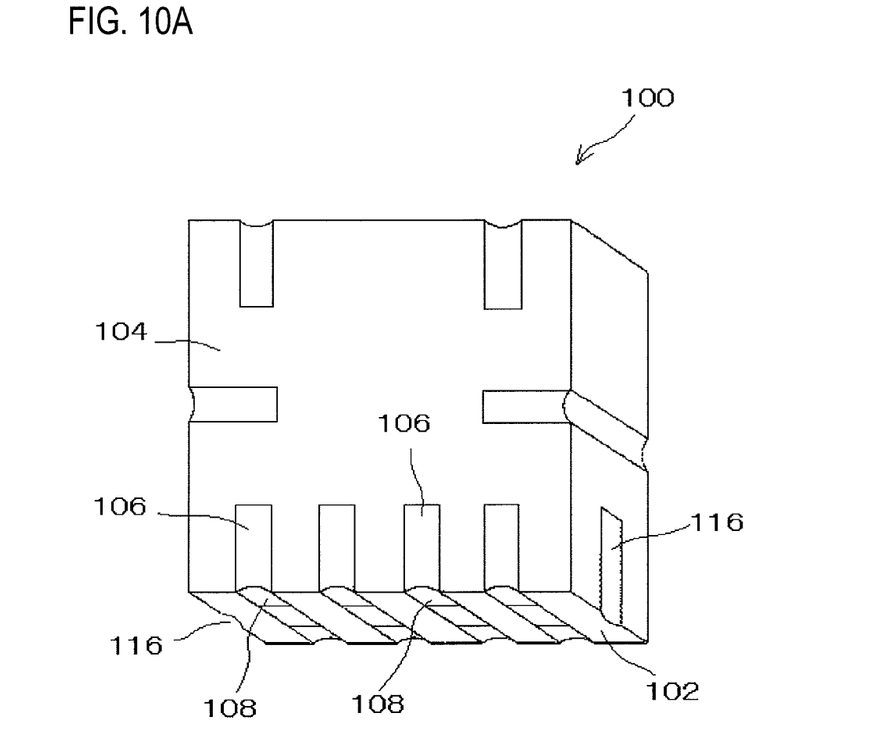
FIGS. 10A and 10B are views for explaining a package for sensor in the relater art.
Figure 10B:
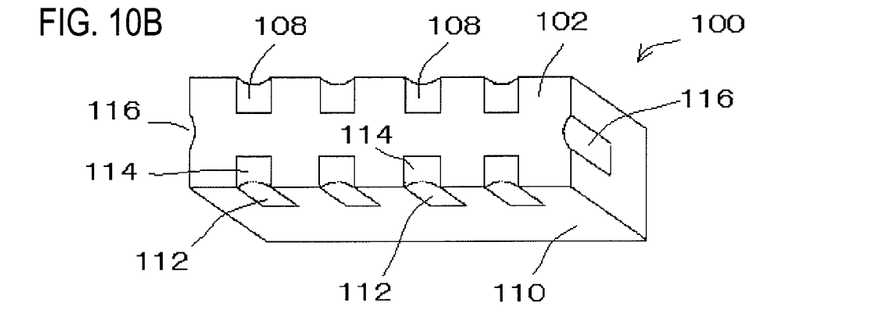

FIGS. 10A and 10B show an outline of a package body constructing the package for electronic component described in Patent Reference 1. A rectangular package body 100 shown in FIGS. 10A and 10B is a package formed by stacking plural ceramic plates, and an MEMS (Micro Electro Mechanical System) is installed as an electronic component.

The package body 100 is vertically mounted as shown in FIG. 10A. Lead terminals 106, 106, . . . are formed in a first side surface 104 intersecting with an end face 102. Lead terminals 108 are extended from each of the lead terminals 106, 106, . . . and formed in the end face 102.

Lead terminals 112, 112, . . . are formed in a second side surface 110 opposed to the first side surface 104. Further, from each of the lead terminals 112, 112, . . . , lead terminals 114 are extended to the end face 102 as shown in FIG. 10B.

Also, metal layers 116, 116 connected by solder are formed in a side surface different from the side surface in which the lead terminals 106, 112 of the package body 100 shown in FIG. 10A are formed in order to reinforce strength of fastening to a mounting substrate of the package body 100 in the case of abutting the end face 102 on a mounting surface of the mounting substrate and perpendicularly mounting the package body 100.

PRIOR ART REFERENCE

Patent Reference

[Patent Reference 1] JP-A-2007-132687

In the case of mounting the package body 100 shown in FIG. 10A perpendicularly to the mounting surface of the mounting substrate, the end face 102 is abutted on the mounting surface of the mounting substrate and each of the lead terminals 108, 114 formed in the end face 102 is abutted on a corresponding pad formed in the mounting surface of the mounting substrate and also each of the metal layers 116, 116 of the package body 100 is abutted on a corresponding pad of the mounting substrate. Then, connection between the pad of the mounting substrate corresponding to each of the lead terminals 108, 114 and the pad of the mounting substrate corresponding to each of the metal layers 116, 116 is made by solder.

However, the package body 100 shown in FIG. 10A is a package formed by stacking and calcining plural ceramic plates, so that it is difficult to form the narrow end face 102 in a flat surface. As a result of this, when the end face 102 is abutted on the mounting surface of the mounting substrate, an angle between the package body 100 and the mounting surface of the mounting substrate is indefinite.

In a sensing apparatus of acceleration etc. in which the angle between the package body 100 and the mounting surface of the mounting substrate is indefinite thus, sensing accuracy by the installed MEMS reduces remarkably and there is fear that it cannot be used as the sensing apparatus.

Therefore, it is necessary to give special consideration so that the angle between the package body 100 and the mounting surface of the mounting substrate is established at a certain angle.

SUMMARY

Exemplary embodiments of the present invention provide a package for electronic component capable of being surely mounted in a mounting surface of a mounting substrate at a predetermined angle to the mounting surface, a manufacturing method of the package for electronic component, and a sensing apparatus.

The present inventor et al. found that an end face of a rectangular package body abutting on a flat mounting surface of a mounting substrate is formed in a flat cut surface and a pad electrically connected to an electrode terminal of an electronic component installed in the package body, is formed on an inner wall surface of a notch part formed at a boundary between a side surface and the cut surface of the package body and the inside of the notch part is filled with solder and thereby the pad of the inside of the notch part can be electrically bonded to a pad formed on the mounting surface of the mounting substrate and also the package body can easily be mounted at a predetermined angle to the mounting surface of the mounting substrate.

A package for electronic component, according to an exemplary embodiment of the present invention, comprises;
 a package body having substantially a rectangular shape, the package body having a flat cut surface to be abutted on a flat mounting surface of a mounting substrate, a first side surface intersecting with the flat cut surface, and a first notch part formed at a boundary between the flat cut surface and the first side surface;
  an electronic component installed in the package body; and
  a first pad electrically connected to the electronic component and formed on an inner wall surface of the first notch part.

The package for sensing element may be mounted on the flat mounting surface of the mounting substrate in a state in which the flat cut surface of the package body abuts perpendicularly on the flat mounting surface of the mounting substrate. Therefore, the package for electronic component can surely be mounted perpendicularly to the mounting surface of the mounting substrate.

The inner wall surface of the first notch part may have an inclined surface, and the first pad may have formed on the inclined surface of the first notch part. Therefore, the first pad can easily be formed and can easily be connected to a wiring pattern extended from an electrode terminal of the electronic component.

The package body may have a second side surface opposed to the first side surface and intersecting the flat cut surface, and a second notch part formed at a boundary between the flat cut surface and the second side surface, and the package for electronic component may further comprise a second pad formed in an inner wall surface of the second notch part. Therefore, inclination of the package for electronic component caused by contraction of melted solder with which the inside of each of the notch parts is filled when each of the first notch part and the second notch part is filled with solder can be prevented.

The inner wall surface of the second notch part may have an inclined surface, and the second pad may be formed on the inclined surface of the second notch part. Therefore, the second notch part has wettability to the melted solder equivalent to the first notch part in which the first pad is formed on the inner wall surface. As a result of this, a meniscus by surface tension of the melted solder with which the insides of the first notch part and the second notch part are filled is also formed equivalently. Also, the second pad can easily be formed by being formed on the inclined surface of the second notch part.

A manufacturing method of a package for electronic component, according to an exemplary embodiment of the present invention, may comprise steps of:

forming a plurality of recessed parts for installation in a plate-shaped body at a predetermined distance, and forming a recessed part for first notch part between the recessed parts for electronic components in the plate-shaped body;

forming a first pad on an inner wall surface of the recessed part for first notch part;

installing the electronic components electrically connected to the first pad in the recessed parts for installation; and cutting the plate-shaped body in the middle of the recessed part for first notch part to form a package body with a substantially rectangular shape which comprises a flat cut surface to be abutted on a flat mounting surface of a mounting substrate, a side surface intersecting with the flat cut surface, and the first notch part having the first pad formed on its inner wall surface and being formed at a boundary between the flat cut surface and the side surface.

The plate-shaped body may be cut so that the package for sensing element is mounted on the flat mounting surface of the mounting substrate in a state in which the flat cut surface of the package body abuts perpendicularly on the flat mounting surface of the mounting substrate. Therefore, the package for electronic component obtained can surely be mounted perpendicularly to the mounting surface of the mounting substrate.

The first pad may be formed on an inclined surface formed in the inner wall surface of the recessed part for first notch portion. The pad can easily be formed and can easily be connected to a wiring pattern extended from an electrode terminal of the sensing element.

The method may further, comprise steps of:

forming a recessed part for second notch part in a side opposite to the recessed part for first notch part in the plate-shaped body; and forming a second pad in an inner wall surface of the recessed part for second notch part. Therefore, the first notch part in which the first pad electrically connected to an electrode terminal of the sensing element installed is formed on the inner wall surface and the second notch part in which the second pad is formed on an inner wall surface can be formed in the end portion of the package for sensor obtained finally. The pads can easily be formed by forming the pads on the inclined surfaces of the inner wall surfaces of the recessed parts for first notch part and second notch part.

A sensing apparatus according to an exemplary embodiment of the present invention comprises:

a mounting substrate having a flat mounting surface and a pad formed on the flat mounting surface; and a package for sensing element, mounted on the mounting substrate, the package for sensing element including a package body having a flat cut surface abutted on the flat mounting surface of the mounting substrate, a first side surface intersecting with the flat cut surface, and a first notch part formed at a boundary between the flat cut surface and the first side surface, a sensing element installed in the rectangular package body, and a first pad electrically connected to the sensing element and formed on an inner wall surface of the first notch part, the package body having substantially a rectangular shape, wherein the first notch part is filled with solder so that the package for sensing element is fastened to the flat mounting surface of the mounting substrate and the first pad formed on the inner wall surface of the first notch part is electrically connected to the pad formed on the flat mounting surface of the mounting substrate.

The package for sensing element may be mounted on the flat mounting surface of the mounting substrate in a state in which the flat cut surface of the package body abuts perpendicularly on the flat mounting surface of the mounting substrate. Therefore, the package for electronic component can surely be mounted perpendicularly to the mounting surface of the mounting substrate, and sensing accuracy of the sensing element can be improved.

The first pad may be formed on an inclined surface formed in the inner wall surface of the first notch part of the package body. Therefore, the pad can easily be formed on the inner wall surface of the first notch part and can easily be connected to a wiring pattern extended from an electrode terminal of the sensing element.

The package body may have a second side surface opposed to the first side surface and intersecting the flat cut surface, and a second notch part formed at a boundary between the flat cut surface and the second side surface, the package for sensing element may further comprise a second pad formed in an inner wall surface of the second notch part, and insides of the first notch part and the second notch part may be filled with solder so that the package for sensing element is fastened to the flat mounting surface of the mounting substrate. Therefore, inclination of the package body caused by contraction of melted solder with which the inside of each of the notch parts is filled can be prevented. The inner wall surfaces of the first notch part and the second notch part show good wettability to the melted solder by the pad formed on the inner wall surface of each of the first notch part and the second notch part. As a result of this, a good meniscus can be formed by surface tension of the melted solder with which the insides of the first notch part and the second notch part are filled. Also, the pad can easily be formed by being formed on the inclined surface formed in each of the first notch part and the second notch part.

The mounting substrate may include a relay substrate arranged in a side of one surface of the mounting substrate, and a surface of the relay substrate may form the flat mounting surface of the mounting substrate. Therefore, a mounting surface of the relay substrate for mounting a package body can be formed in a flat surface even when a surface of the mounting substrate is formed in an uneven surface.

The relay substrate may include a silicon substrate or a ceramic substrate.

In the package for electronic component according to the exemplary embodiments of the present invention, an end face of the package body abutting on the mounting surface of the mounting substrate side is formed by the flat cut surface.

Further, the first pad electrically connected to the electrode terminal of the electronic component is formed on the inner wall surface of the first notch part formed at the boundary between the first side surface and the cut surface of the package body and it is unnecessary to form a pad on the cut surface abutting on the mounting surface of the mounting substrate.

As a result of this, the package for electronic component can surely be attached at the predetermined angle to the mounting surface of the mounting substrate side easily by abutting the cut surface of the package body for forming the package for electronic component on the mounting surface of the mounting substrate side.

Also, by filling the inside of the notch part of the package for electronic component attached at the predetermined angle to the mounting surface of the mounting substrate side with solder, the package for electronic component attached to the mounting surface of the mounting substrate side is fastened and also the pad formed on the mounting surface of the mounting substrate side can be electrically connected to the pad electrically connected to the electronic component installed in the package body.

As a result of that, in the case of mounting the package for electronic component in the mounting surface of the mounting substrate, the package for electronic component can surely be attached at the predetermined angle to the mounting surface of the mounting substrate side easily and the package for electronic component can be fastened and electrically connected to the mounting substrate by the solder with which the notch part is filled.

Other features and advantages may be apparent from the following detailed description, the accompanying drawings and the claims.

DETAILED DESCRIPTION

Embodiments of the invention will hereinafter be described with reference to the accompanying drawings.

Figure 1:
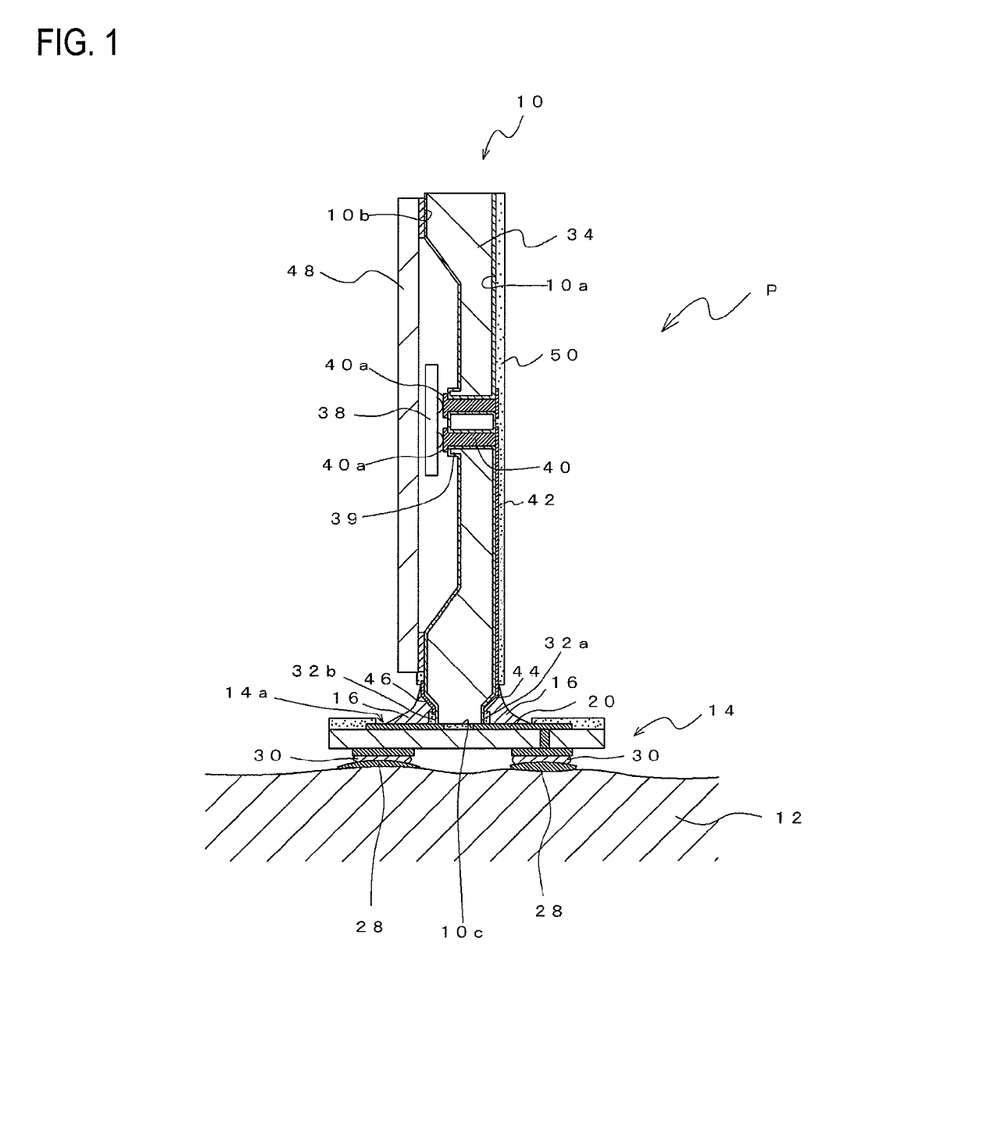
FIG. 1 is a longitudinal sectional view showing an embodiment of a sensing apparatus according to the present invention.

FIG. 1 is a longitudinal sectional view showing an embodiment of a sensing apparatus according to the present invention. In the sensing apparatus shown in FIG. 1, a sensing element for sensing acceleration etc. as an electronic component is installed in a package P for sensor which is a package for electronic component.

The package P for sensor is mounted in the side of one surface of a mounting substrate 12 through a relay substrate 14. The relay substrate 14 has one surface formed as a mounting surface 14a for mounting the package P for sensor and the other surface formed as a connection surface connected to the mounting substrate 12. The mounting surface 14a of the relay substrate 14 is formed in a flat horizontal surface.

An end face 10c of a rectangular package body 10 for forming the package P for sensor abuts on the mounting surface 14a of the relay substrate 14, and the package P for sensor is mounted perpendicularly (mounted vertically) to the mounting surface 14a of the relay substrate 14.

The end face 10c of the package body 10 is formed in a flat cut surface and the package P for sensor is fastened to the relay substrate 14 by solders 16, 16.

Figure 2:
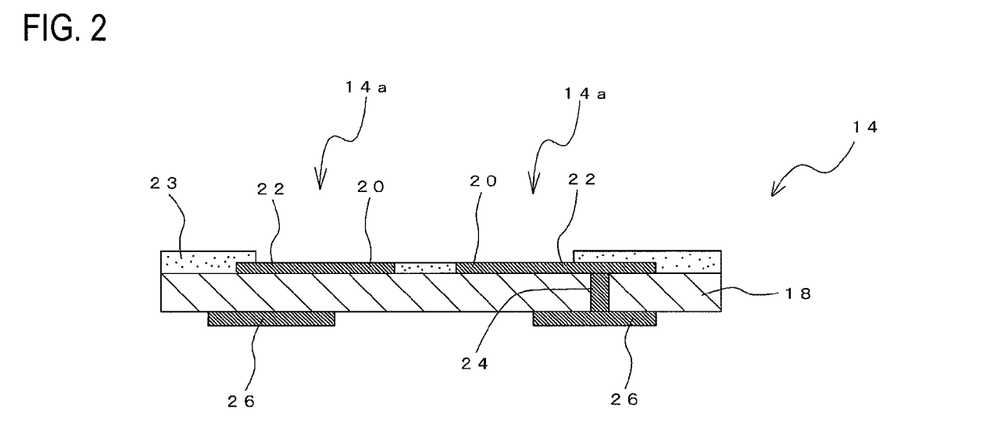
FIG. 2 is a sectional view showing a relay substrate of the sensing apparatus shown in FIG. 1.

As shown in FIG. 2, in the relay substrate 14, pads 20, 20 formed on one surface (mounting surface 14a side) of a flat plate-shaped silicon substrate 18 are electrically connected to pads 26, 26 formed on the other surface (connection surface side) of the silicon substrate 18 through a via 24 extending through the silicon substrate 18 and wiring patterns 22, 22 formed on the one surface of the silicon substrate 18. These wiring patterns 22, 22 and pads 20, 20 are covered with a solder resist 23 excluding a place necessary to make connection to the package body 10.

The pads 26, 26 formed on the other surface of the silicon substrate 18 are connected to pads 28, 28 formed on a surface of the mounting substrate 12 by solders 30, 30 as shown in FIG. 1.

By arranging the relay substrate 14 in the side of one surface of the mounting substrate 12 thus, the mounting surface 14a of the relay substrate 14 for mounting the package body 10 can be formed in a flat surface even when the surface of the mounting substrate 12 is formed in an uneven surface.

In addition, it is preferable to form the wiring pattern 22 or the pad 20 in the silicon substrate 18 after the side of one surface of the silicon substrate 18 is polished so that the one surface of the silicon substrate 18 is made to be a flat surface.

Figure 3:
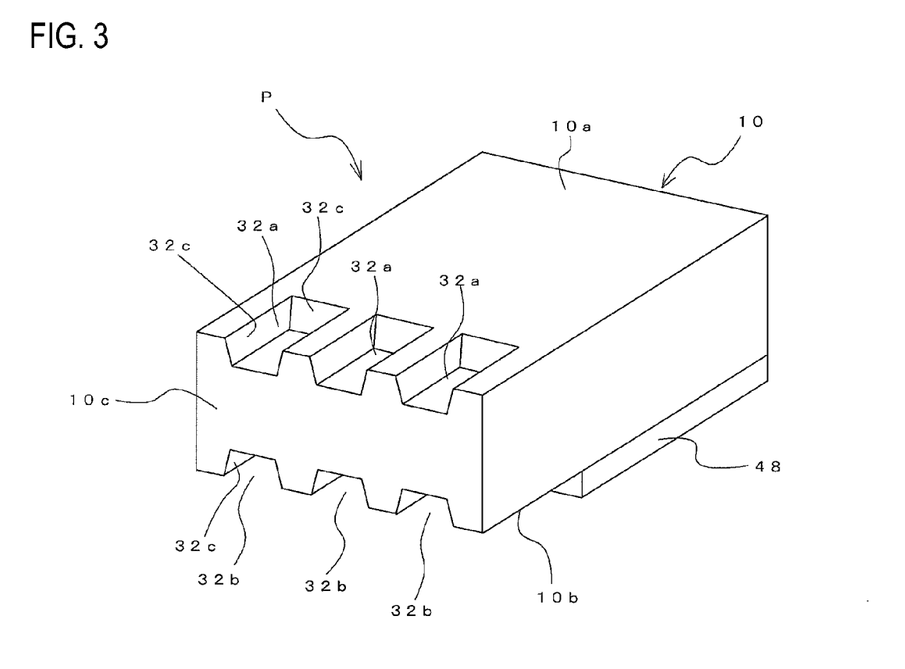
FIG. 3 is a perspective view showing a package P for sensor of the sensing apparatus shown in FIG. 1.

FIG. 3 shows a perspective view of the package P for sensor shown in FIG. 1. The package body 10 shown in FIG. 3 has substantially a rectangular shape and is formed by a flat plate-shaped silicon substrate 34 (shown in FIG. 1). In the silicon substrate 34, a first side surface 10a and a second side surface 10b (corresponding to a surface to which a lid body 48 is attached in the package P for sensor shown in FIG. 1) opposed to the first side surface 10a are formed and also the end face 10c orthogonal to the first side surface 10a and the second side surface 10b is formed. The end face 10c has an area smaller than that of the first side surface 10a and the second side surface 10b.

The end face 10c is an abutment surface abutting on the mounting surface 14a of the relay substrate 14, and first notch parts 32a, 32a, 32a are formed at a boundary between the orthogonal first side surface 10a and the end face 10c as shown in FIG. 3. The notch part 32a is opened in the first side surface 10a and the end face 10c, and side wall surfaces of the first notch part 32a are formed in inclined surfaces 32c, 32c, 32c in which an angle intersecting with the first side surface 10a becomes an obtuse angle.

Further, the second side surface 10b orthogonal to the end face 10c is formed in a side surface opposed to the first side surface 10a as shown in FIG. 3. Second notch parts 32b, 32b, 32b are also formed at a boundary between the second side surface 10b and the end face 10c. The second notch part 32b is opened in the second side surface 10b and the end face 10c, and side wall surfaces of the second notch part 32b are formed in inclined surfaces 32c, 32c, 32c in which an angle intersecting with the second side surface 10b becomes an obtuse angle.

As a result of this, as shown in FIG. 3, an outer periphery of the end face 10c of the package body 10 becomes an uneven shape by the first notch parts 32a, 32a, 32a and the second notch parts 32b, 32b, 32b, but the end face 10c is a flat surface.

In addition, in FIG. 3, illustration of a wiring pattern etc. is omitted since a shape of the package body 10 is described.

Figure 4A:
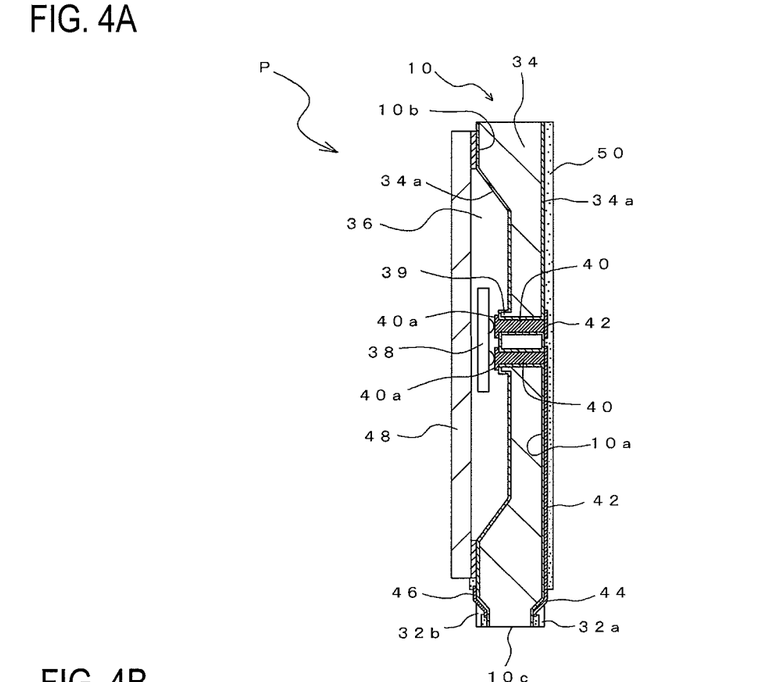
FIG. 4A is a longitudinal sectional view showing the package P for sensor shown in FIG. 3.
Figure 4B:
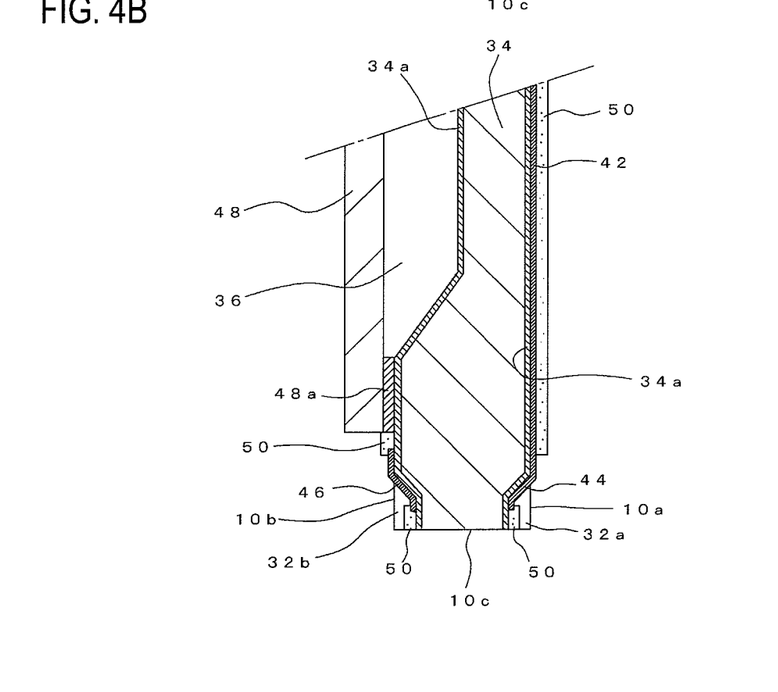
FIG. 4B is a partially enlarged view of the package P for sensor shown in FIG. 3.

FIG. 4A shows a longitudinal sectional view of the package P for sensor shown in FIG. 3, and FIG. 4B shows a partially enlarged view of the package P.

A recessed part 36 for installation is formed in the second side surface 10b shown in FIG. 3 of the silicon substrate 34 of the package body 10 for forming the package P for sensor as shown in FIG. 4A. A top surface of a protrusion part 39 protruding from a bottom surface of the recessed part 36 for installation is formed in an installation surface in which a sensing element 38 such as an MEMS is installed.

All the surfaces of the first side surface 10a and the second side surface 10b of the silicon substrate 34 are covered with an insulating layer 34a made of $SiO_2$. "All the surfaces" include an inner wall surface of the recessed part 36 for installation, a surface of the protrusion part 39, inner wall surfaces of the first notch parts 32a, 32a, 32a and the second notch parts 32b, 32b, 32b, and inner wall surfaces of via holes 41 for forming vias 40 described below.

In the top surface of the protrusion part 39 protruding from the bottom surface of the recessed part 36 for installation, pads 40a, 40a connected to each electrode terminal of the sensing element 38 are formed on the insulating layer 34a. The pads 40a, 40a are electrically connected to a pad 44 formed on the insulating layer 34a of the inner wall surface of the first notch part 32a through a wiring pattern 42 formed on the insulating layer 34a of the first side surface 10a (FIG. 3) of the silicon substrate 34 and the vias 40, 40 extending through the silicon substrate 34. As a result of this, a pad etc. are not formed in the end face 10c of the package body 10 and a flat surface can be held in the end face 10c of the package body 10.

The pad 44 is preferably formed on all the surface of the inner wall surface of the first notch part 32a excluding the vicinity of the edge of intersection with the end face 10c, but could be formed on at least the inclined surface 32c of the first notch part 32a. Particularly, the pad 44 is preferably formed on the inclined surface 32c opposed to an opening part opened in the end face 10c of the first notch part 32a. The pad 44 may be extended on the first side surface 10a.

The wiring patterns 42 . . . formed on the first side surface 10a of the package body 10 are covered with a solder resist 50 excluding the pad 44. The portion of the vicinity of the edge of intersection with the end face 10c of the pad 44 is also covered with the solder resist 50.

The sensing element 38 installed inside the recessed part 36 for installation of the silicon substrate 34 is sealed with the lid body 48 with which an opening part of the recessed part 36 for installation is covered. The lid body 48 is pasted on the silicon substrate 34 by an adhesive 48a.

Also, a dummy pad 46 made of metal such as copper is also formed on each of the inner wall surfaces of the second notch parts 32b, 32b, 32b formed in the package body 10 as shown in FIG. 4A. The dummy pad 46 is preferably formed on all the surface of the inner wall surface of the second notch part 32b excluding the vicinity of the edge of intersection with the end face 10c, but could be formed on at least the inclined surface 32c of the second notch part 32b. Particularly, the dummy pad 46 is preferably formed on the inclined surface 32c opposed to an opening part opened in the end face 10c of the second notch part 32b. The dummy pad 46 may be extended on the second side surface 10b.

The portion formed in the second side surface 10b among the dummy pad 46 formed on the second side surface 10b of the package body 10 is covered with the solder resist 50, and the portion of the vicinity of the edge of intersection with the end face 10c of the dummy pad 46 is also covered with the solder resist 50.

In addition, a passive component such as a semiconductor element or a capacitor together with the sensing element 38 such as the MEMS may simultaneously be installed inside the recessed part 36 for installation.

The package P for sensor can be manufactured by a method shown in FIGS. 5A to 5F. FIGS. 5A to 5F show a state of upward turning the side of the second side surface 10b of the package body 10 shown in FIG. 1.

Figure 5A:
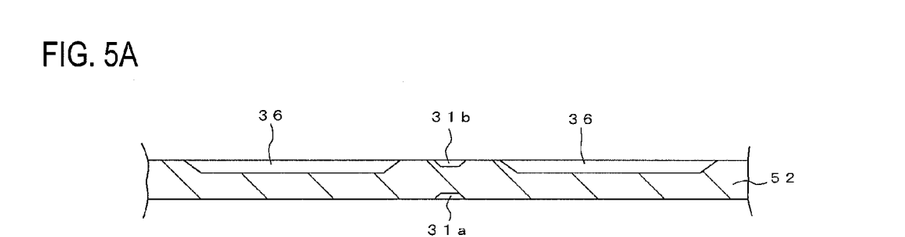
FIGS. 5A to 5F show manufacturing steps of the package P for sensor shown in FIG. 4A.

First, as shown in FIG. 5A, chemical etching is performed in the sides of both surfaces of a flat plate-shaped silicon plate 52 as a plate-shaped body, and plural recessed parts 36, 36 for installation for installing the sensing element 38 are formed in the side of one surface of the silicon plate 52 at a predetermined distance, and a recessed part 31a for first notch part is formed in the portion corresponding to a middle part of the recessed parts 36, 36 for installation in the side of the other surface of the silicon plate 52 and also, a recessed part 31b for second notch is formed in the middle part of the recessed parts 36, 36 for installation in correspondence with the recessed part 31a for first notch part. Shapes of the recessed part 36 for installation, the recessed part 31a for first notch part and the recessed part 31b for second notch are an inverted trapezoid shape in which an opening part opened in the side of one surface or the side of the other surface of the silicon plate 52 becomes wider than a bottom surface.

In addition, the chemical etching is performed in a state of depositing a mask by a resist for etching on the sides of both surfaces of the silicon plate 52 so as to etch predetermined places of the sides of both surfaces of the silicon plate 52.

Figure 5B:
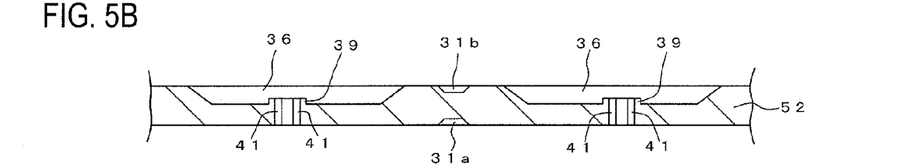

Further, as shown in FIG. 5B, via holes 41, 41 are formed in an installation surface for installing the sensing element 38 of each of the recessed parts 36, 36 for installation by dry etching. The dry etching is also performed in a state of depositing a mask by a resist for etching on the sides of both surfaces of the silicon plate 52 so as to etch a predetermined place of the silicon plate 52.

In the case of the dry etching, bottom surfaces of the recessed parts 36, 36 for installation excluding the portions in which the via holes 41, 41 are formed are dug, and the portions in which the via holes 41, 41 are formed are formed in protrusion parts 39 protruding from the bottom surfaces of the recessed parts 36, 36 for installation.

By installing the sensing element 38 in the protrusion part 39 as described below, the sensing element 38 can be set in a state of being separated from the bottom surface of the recessed part 36 for installation and sensing accuracy by the sensing element 38 can be improved.

Figure 5C:
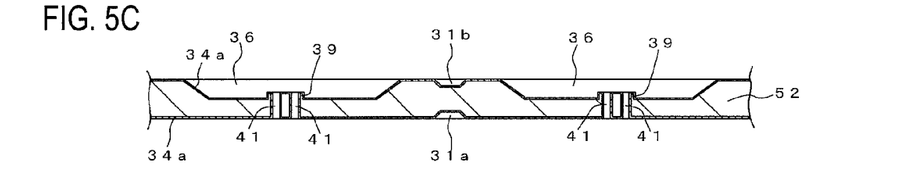

Thermal oxidation treatment is performed in the silicon plate 52 in which the recessed parts 36, 36 for installation and via holes 41, 41 are formed, and an insulating layer 34a made of $SiO_2$ is formed on all the surface of the silicon plate 52 including inner wall surfaces of the via holes 41, 41 as shown in FIG. 5C.

In addition, the insulating layer 34a may be formed by forming a film made of SiO$_2$ or SiN on all the surface of the silicon plate 52 including the inner wall surfaces of the via holes 41, 41 by CVD or sputtering, or the insulating layer 34a may be formed by a method of application etc. of an insulating resin such as epoxy or polyimide.

Figure 5D:
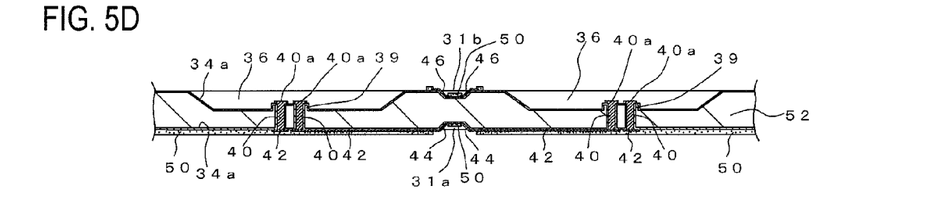

Then, as shown in FIG. 5D, the insides of the via holes 41, 41 are filled with metal and vias 40, 40 are formed and also, wiring patterns 42, 42 extending from the vias 40, 40 are extended toward the recessed part 31a for first notch part and a pad 44 is formed on an inner wall surface of the recessed part 31a for first notch part. Further, a dummy pad 46 is formed on an inner wall surface of the recessed part 31b for second notch part.

In order to improve wettability to solder 16, a foundation plated layer made of a nickel plated layer is formed on the pad 44 and dummy pad 46 and a gold plated layer is further formed on the foundation plated layer.

Also, pads 40a, 40a bonded to an electrode terminal of the installed sensing element 38 are formed on a top surface of the protrusion part 39 of the vias 40, 40. In order to improve properties of bonding to the electrode terminal of the sensing element 38, a foundation plated layer made of a nickel plated layer is formed on the pads 40a, 40a and a gold plated layer is further formed on the foundation plated layer.

The vias 40, 40, pads 40a, 40a, wiring pattern 42, pad 44 and dummy pad 46 can be formed by copper plating. For example, after a thin film copper layer is formed on all the surface of the silicon plate 52 including the inner wall surfaces of the via holes 41, 41 by electroless copper plating or sputtering, etc., patterning is performed by a photosensitive resist and then electrolytic copper plating using the thin film copper layer as a power feeding layer is performed and a copper layer as the pads 40a, 40a, the wiring pattern 42, the pad 44 and the dummy pad 46 can be formed while filling the insides of the via holes 41, 41 with copper. Thereafter, insulation between the copper layers as the vias 40, 40, the pads 40a, 40a, the wiring pattern 42, the pad 44 and the dummy pad 46 can be achieved by peeling the photosensitive resist and etching and removing the exposed thin film copper layer.

The pads 40a, 40a bonded to the electrode terminal of the installed sensing element 38 are formed on the end of the side of the recessed part 36 for installation of the vias 40, 40 formed in this manner.

Further, in order to improve wettability to the solder 16 or properties of bonding to the electrode terminal of the sensing element 38, a foundation plated layer made of a nickel plated layer is formed on the pads 40a, 40; the pad 44 and dummy pad 46 and a gold plated layer is further formed on the foundation plated layer.

Thereafter, the center of each of the bottom surfaces of the recessed part 31a for first notch part and the recessed part 31b for second notch and the wiring pattern 42 formed in the side of the other surface of the silicon plate 52 are covered with a solder resist 50.

Figure 5E:
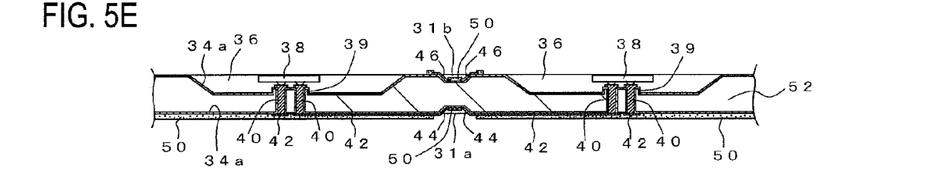

Further, as shown in FIG. 5E, the sensing element 38 is installed in each of the recessed parts 36, 36 for installation. In this case, each of the electrode terminals of the sensing element 38 is electrically connected to the pad 44 exposed to the inner wall surface of the recessed part 31a for first notch part through the corresponding pad 40a, the via 40 and the wiring pattern 42.

Figure 5F:
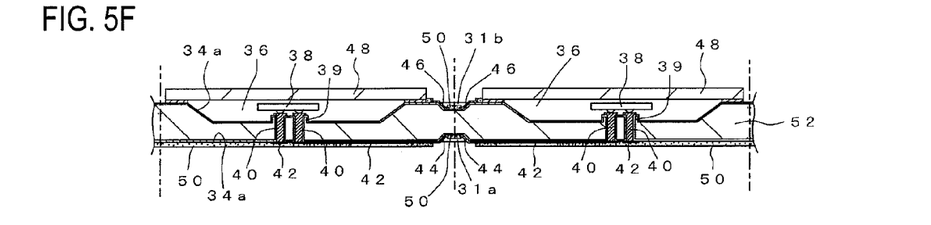

The sensing element 38 is sealed by depositing a lid body 48 on each of the opening parts of the recessed parts 36, 36 for installation in which the sensing element 38 is installed as shown in FIG. 5F.

Thereafter, packages P, P for sensor are obtained by cutting the silicon plate 52 in a position shown by a chain line of FIG. 5F by a dicing blade. In this case, the silicon plate 52 is cut in the center of the solder resist 50 formed in the center of each of the bottom surfaces of the recessed part 31a for first notch part and the recessed part 31b for second notch part.

Thus, a cut surface formed by cutting the silicon plate 52 in the center of each of the bottom surfaces of the recessed part 31a for first notch part and the recessed part 31b for second notch part is a flat surface, and the package P for sensor shown in FIG. 4A using this cut surface as the end face 10c can be obtained.

As the lid body 48, a silicon plate or a glass plate can be used. When the silicon plate or the glass plate is used as the lid body 48, the lid body 48 can be bonded to the silicon substrate 34 by anode bonding. In the anode bonding, the need for an adhesive can be eliminated and the recessed part 36 for installation can be set in a highly airtight state. The highly airtight state is preferable in improving sensing accuracy of the sensing element 38.

In addition, in FIG. 5F, the silicon plate 52 is cut after the sensing element 38 installed in each of the recessed parts 36, 36 for installation is sealed. However, the package P for sensor may be obtained by installing the sensing element 38 in the recessed part 36 for installation of the package body 10 of each individual piece obtained by cutting the silicon plate 52 after the vias 40, 40, the pads 40a, 40a, the wiring pattern 42, the pad 44 and the dummy pad 46 are formed in a step of FIG. 5D, and then sealing the recessed part 36 for installation with the lid body 48.

Figure 6:
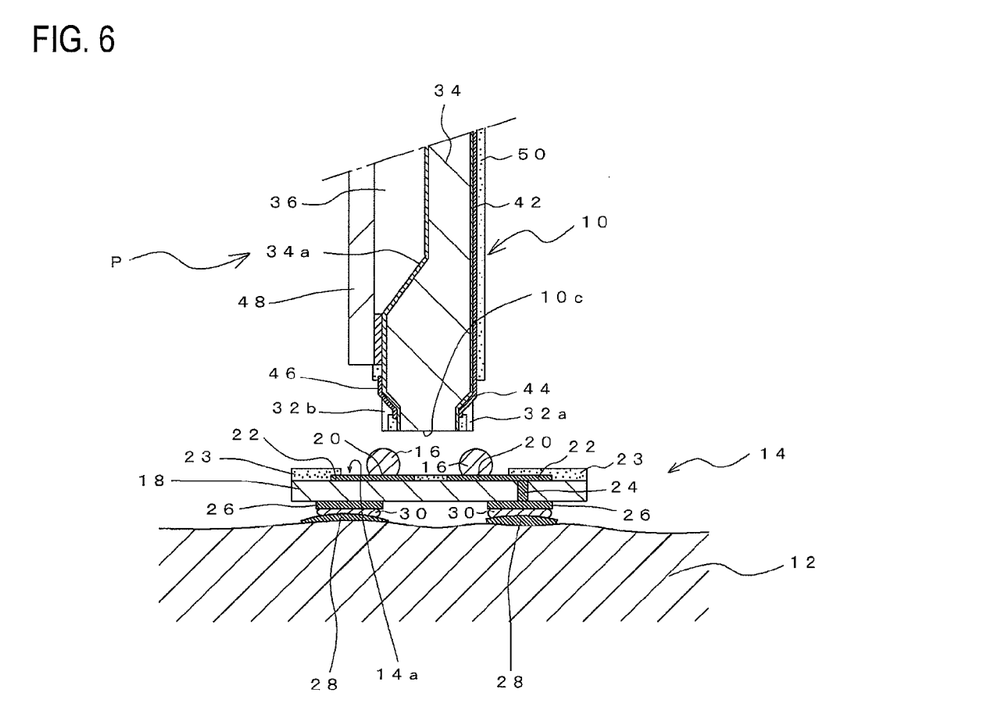
FIG. 6 is a view for explaining a state immediately before a cut surface of the package P for sensor abuts on the relay substrate disposed on a mounting substrate.

In the case of mounting the obtained package P for sensor shown in FIG. 4A, a cut surface (hereinafter it may simply be called a cut surface 10c) which is the end face 10c of the package body 10 for forming the package P for sensor is moved closer to the mounting surface 14a of the relay substrate 14 as shown in FIG. 6.

The pads 26, 26 of the relay substrate 14 are bonded to the pads 28, 28 of the mounting substrate 12 by the solders 30. As a result of this, even when a formation surface of the pads 28, 28 of the mounting substrate 12 is an uneven surface and there is a difference between surface heights of the pads 28, 28, such a difference can be absorbed by the solders 30 and the mounting surface 14a of the relay substrate 14 can be adjusted so as to become a horizontal surface.

The solders 16, 16 are placed on the pads 20, 20 formed on the mounting surface 14a of the relay substrate 14.

Figure 7:
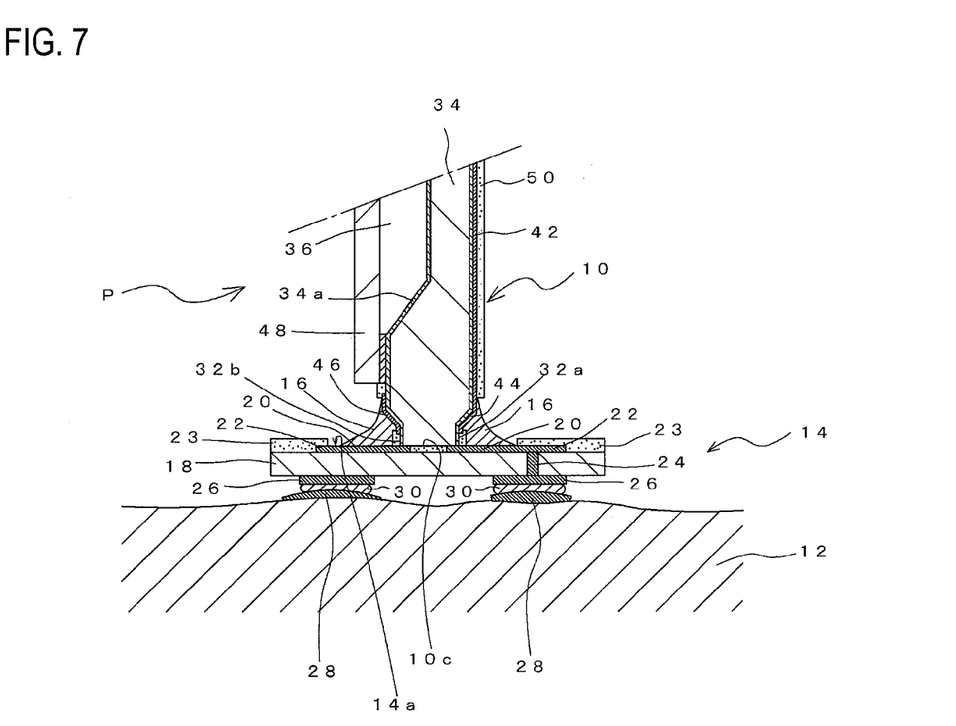
FIG. 7 is a view for explaining a state that the cut surface of the package P for sensor abuts on the relay substrate disposed on the mounting substrate.

When the cut surface 10c of the package P for sensor abuts on the mounting surface 14a of the relay substrate 14, the solders 16 are melted and make contact with the pad 44 formed on an inner wall surface of the first notch part 32a of the package body 10 and the inside of the first notch part 32a is filled with the solders 16 by its surface tension and a meniscus is formed as shown in FIG. 7. The solders 16 with which the inside of the first notch part 32a is filled in this manner make electrical connection between the pad 44 of the package P for sensor and the pads 20, 20 of the relay substrate 14 and also fasten the package P for sensor perpendicularly to the mounting surface 14a of the relay substrate 14.

Also, as shown in FIG. 7, when the cut surface 10c of the package P for sensor abuts on the mounting surface 14a of the relay substrate 14, the melted solders 16 make contact with the dummy pad 46 formed on an inner wall surface of the second notch part 32b of the package body 10 and the inside of the second notch part 32b is filled with the solders 16 by its surface tension and a meniscus is formed. The solders 16 with which the inside of the second notch part 32b are filled in this manner fasten the package P for sensor perpendicularly to the mounting surface of the relay substrate 14 (vertical mounting).

Since the pad 44 or the dummy pad 46 is formed on the inclined surfaces 32c which are the inner wall surfaces of the first notch part 32a and second notch part 32b, when the insides of the first notch part 32a and the second notch part 32b are filled with the solders in the case of mounting the package P for sensor in the relay substrate 14, a good meniscus is formed and the package P for sensor can accurately be mounted perpendicularly to the mounting surface 14a of the relay substrate 14.

By the pad 44 or the dummy pad 46, wettability to the solders 16 can be improved and a situation in which the solders 16 flow out of the insides of the first notch part 32a and the second notch part 32b and a short circuit in the adjacent pad 44 is caused can be prevented.

Further, when the melted solders 16 with which the insides of the first notch part 32a and the second notch part 32b are filled coagulate, its contraction force cancels each other out and inclination of the package P for sensor can be prevented.

The sensing apparatus in which the package P for sensor in which the sensing element 38 is installed is attached perpendicularly (mounted vertically) to the mounting surface 14a formed in a horizontal surface of the relay substrate 14 disposed on the mounting substrate 12 thus is used in an automobile, a mobile telephone and other electronic apparatus, and can sense acceleration, angular speed, inclination, etc. Particularly, the sensing apparatus in which the package P for sensor is mounted perpendicularly can sense directionality with high accuracy.

Also, the relay substrate 14 capable of attaching plural packages P, P . . . for sensor is arranged on the mounting substrate 12 and thereby, a sensing apparatus in which the packages P, P . . . for sensor are attached on the mounting substrate 12 at high density can be provided.

In the package P for sensor shown in FIGS. 1 to 7, the pad 44 electrically connected to the sensing element 38 is formed inside the first notch part 32a of the package body 10 and the dummy pad 46 is formed inside the second notch part 32b. However, the pad 44 may be formed inside the second notch part 32b and may be electrically connected to an electrode terminal of the sensing element 38 installed on a bottom surface of the recessed part 36 for installation of the package body 10 by the wiring pattern 42 formed so as to be drawn on the second side surface 10b along an inner wall surfaces of the recessed part 36 for installation as shown in FIG. 8.

By installing the sensing element 38 in the wiring pattern 42 formed along the inner wall surfaces of the recessed part 36 for installation thus, the need for formation of the vias 40, 40 can be eliminated and a structure of the package P for sensor can be simplified.

Figure 8:
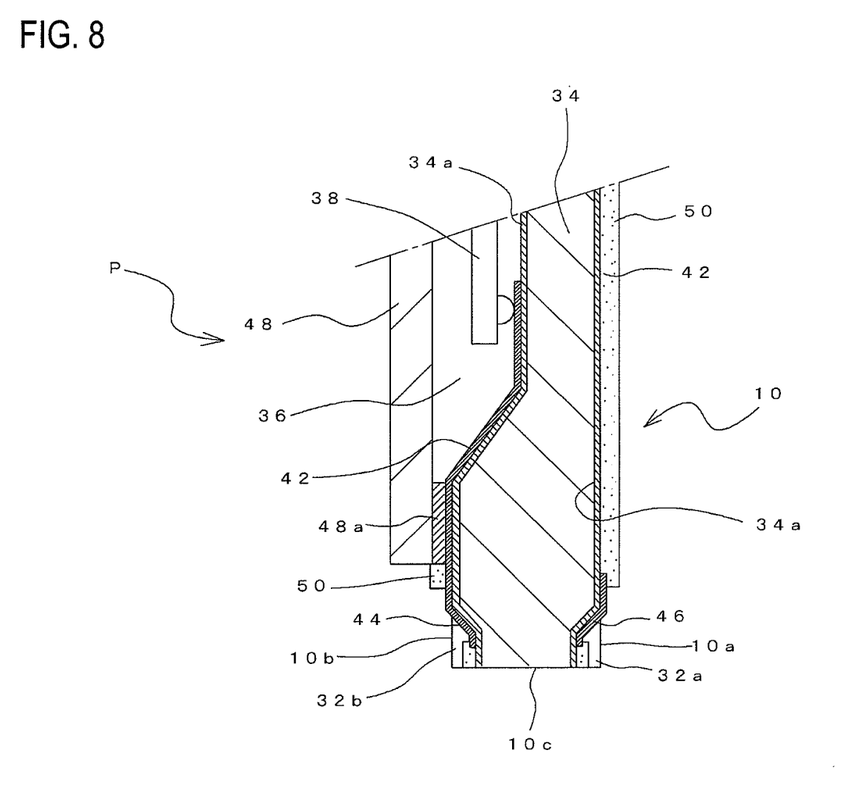
FIG. 8 is a partially enlarged view showing another example of a package P for sensor.

The dummy pad 46 is formed inside the first notch part 32a of the package body 10 of the package P for sensor shown in FIG. 8.

In addition, the pads 44 electrically connected to an electrode terminal of the sensing element 38 may be formed in both of the first notch part 32a and the second notch part 32b of the package body 10 by combining the package P for sensor shown in FIG. 1 and the package P for sensor shown in FIG. 8.

In the package body 10 of the package P for sensor described above, the first notch part 32a and the second notch part 32b are oppositely formed in the first side surface 10a and the second side surface 10b. However, the first notch part 32a and the second notch part 32b are may be formed in a staggered state if tension of the solders 16, 16 with which the first notch part 32a and the second notch part 32b are filled could cancel each other out. Further, only one of the first notch parts 32a, 32a . . . in which the dummy pads 46 are disposed and the second notch parts 32b, 32b . . . in which the pads 44 are disposed may be formed.

Also, in a bottom surface of the recessed part 36 for installation of the package body 10, a wiring pattern may be drawn from the vias 40, 40 and the sensing element 38 may be installed in a pad formed on the end of the wiring pattern.

Further, the relay substrate 14 is arranged on the mounting substrate 12, but when a mounting surface of the mounting substrate 12 is a horizontal surface, it may be mounted in a state in which the cut surface 10c of the package P for sensor is abutted directly on the mounting surface of the mounting substrate 12. In this case, the pad 44 and the dummy pad 46 of the package P for sensor are connected to the pad 28 of the mounting substrate 12 by solder.

Also, in the package body 10, the silicon substrate 34 is used, but a glass substrate or a resin substrate can be used. In this case, the need for formation of the insulating layer 34a is eliminated.

Further, in the relay substrate 14, the silicon substrate 18 is used, but a ceramic substrate or a glass substrate can be used. Also in this case, the need for formation of an insulating layer is eliminated.

Figure 9:
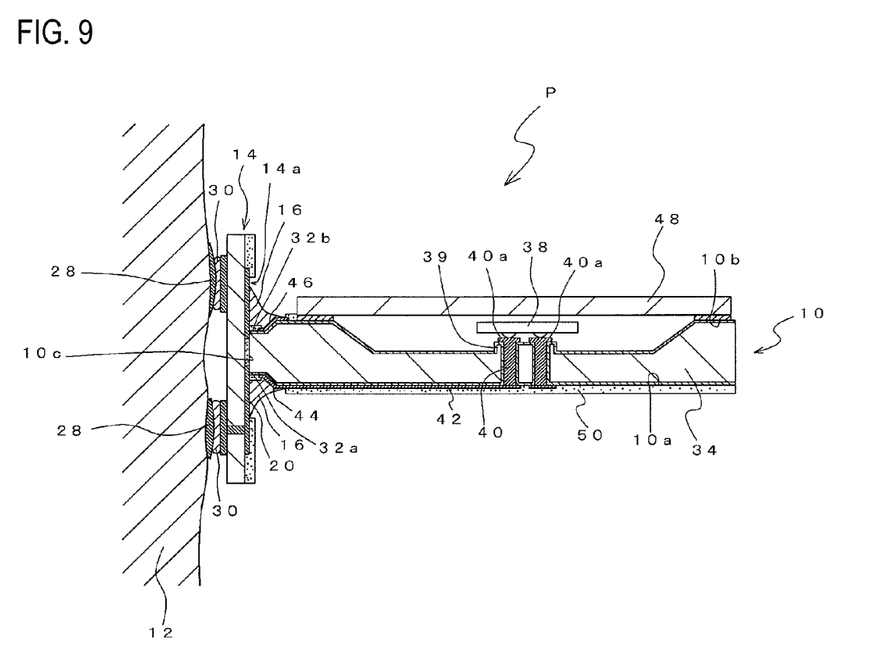
FIG. 9 is a longitudinal sectional view showing another embodiment of a sensing apparatus according to the present invention.

In the sensing apparatus described above, the end face 10c of the package body 10 abuts on the mounting surface 14a which is a flat horizontal surface formed in the relay substrate 14 and the package P for sensor is mounted perpendicularly (mounted vertically) to the mounting surface 14a of the relay substrate 14, but a sensing apparatus shown in FIG. 9 may be used.

In the sensing apparatus shown in FIG. 9, the relay substrate 14 is disposed in the side of one surface of the mounting substrate 12 placed in a vertical state. The end face 10c of the package P for sensor abuts on the mounting surface 14a which is a flat vertical surface formed in the relay substrate 14. As a result of this, the package P for sensor is mounted perpendicularly (mounted horizontally) to the mounting surface 14a of the relay substrate 14.

The package P for sensor shown in FIG. 9 is mounted in the relay substrate 14 so as to position the lid body 48 upward, but the package P for sensor may be mounted in the relay substrate 14 so as to position the lid body 48 downward.

Also, instead of the sensing element 38, a semiconductor element may be installed in the package body 10. A package for semiconductor apparatus in which the semiconductor element is installed in the package body 10 thus is mounted in a state in which the end face 10c of the package body 10 abuts on the mounting surface 14a of the relay substrate 14 disposed in the side of one surface of the mounting substrate 12. Therefore, in the package for semiconductor apparatus, as compared with a related-art package for semiconductor apparatus mounted in a state in which the whole surface of the side of one surface of the package body 10 is abutted on the mounting surface, its the mounting area can become smaller and a mounting density of the package body per mounting area can be improved.

Further, instead of the solder 16, the package P for sensor may be mounted using a conductive paste in which a metal filler such as silver or gold is contained in a resin such as an epoxy resin or a polyimide resin.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A package for electronic component, comprising:
a package body having substantially a rectangular shape, the package body having
a flat cut surface facing and abutted on a flat mounting surface of a mounting substrate,
a first side surface intersecting and substantially orthogonal with the flat cut surface,
a second side surface opposed to the first side surface and intersecting and substantially orthogonal with the flat cut surface, and
a first notch part formed at a boundary between the flat cut surface and the first side surface;
an electronic component installed in the package body; and
a first pad electrically connected to the electronic component and formed on an inner wall surface of the first notch part, wherein the first notch part extends a portion of a thickness defined by a distance between the first side surface and the second side surface.

2. A package for electronic component as claimed in claim 1, wherein the inner wall surface of the first notch part has an inclined surface, and the first pad is formed on the inclined surface of the first notch part.

3. A package for electronic component as claimed in claim 1, wherein a second notch part is formed at a boundary between the flat cut surface and the second side surface, and
wherein the package for electronic component further comprises a second pad formed in an inner wall surface of the second notch part.

4. A package for electronic component as claimed in claim 3, wherein the inner wall surface of the first notch part has an inclined surface, and the first pad is formed on the inclined surface of the first notch part, and
wherein the inner wall surface of the second notch part has an inclined surface, and the second pad is formed on the inclined surface of the second notch part.

5. A manufacturing method of a package for electronic component, the method comprising steps of:
forming a plurality of recessed parts for installation in a plate-shaped body at a predetermined distance, and forming a recessed part for first notch part between the recessed parts for installation in the plate-shaped body;
forming a first pad on an inner wall surface of the recessed part for first notch part;
installing the electronic components in the recessed parts for installation, the electronic components being electrically connected to the first pad; and
cutting the plate-shaped body in the middle of the recessed part for first notch part to form a package body with a substantially rectangular shape which comprises a flat cut surface to be abutted on a flat mounting surface of a mounting substrate, a side surface intersecting with the flat cut surface, and the first notch part having the first pad formed on the inner wall surface of the recessed part for first notch part and being formed at a boundary between the flat cut surface and the side surface.

6. A manufacturing method of a package for electronic component as claimed in claim 5, wherein the first pad is formed on an inclined surface formed in the inner wall surface of the recessed part for first notch portion.

7. A manufacturing method of a package for electronic component as claimed in claim 5, further comprising steps of forming a recessed part for second notch part in a side opposite to the recessed part for first notch part in the plate-shaped body; and
forming a second pad in an inner wall surface of the recessed part for second notch part.

8. A manufacturing method of a package for electronic component as claimed in claim 7, wherein the first pad is formed on an inclined surface formed in the inner wall surface of the recessed part for first notch portion, and
wherein the second pad is formed on an inclined surface formed in the inner wall surface of the recessed part for second notch part.

9. A sensing apparatus comprising:
a mounting substrate having a flat mounting surface and a pad formed on the flat mounting surface; and
a package for sensing element, mounted on the mounting substrate, the package for sensing element including a package body having
a flat cut surface facing and abutted on the flat mounting surface of the mounting substrate,
a first side surface intersecting and substantially orthogonal with the flat cut surface,
a second side surface opposed to the first side surface and intersecting and substantially orthogonal with the flat cut surface, and
a first notch part formed at a boundary between the flat cut surface and the first side surface, a sensing element installed in the package body, and a first pad electrically connected to the sensing element and formed on an inner wall surface of the first notch part, the package body having substantially a rectangular shape,
wherein the first notch part is filled with solder so that the package for sensing element is fastened to the flat mounting surface of the mounting substrate and the first pad formed on the inner wall surface of the first notch part is electrically connected to the pad formed on the flat mounting surface of the mounting substrate, and
wherein the first notch part extends a portion of a thickness defined by a distance between the first side surface and the second side surface.

10. A sensing apparatus as claimed in claim 9, wherein the package for sensing element is mounted on the flat mounting surface of the mounting substrate in a state in which the flat cut surface of the package body abuts perpendicularly on the flat mounting surface of the mounting substrate.

11. A sensing apparatus as claimed in claim 9, wherein the first pad is formed on an inclined surface formed in the inner wall surface of the first notch part of the package body.

12. A sensing apparatus as claimed in claim 9, wherein a second notch part is formed at a boundary between the flat cut surface and the second side surface,
wherein the package for sensing element further comprises a second pad formed in an inner wall surface of the second notch part, and
wherein insides of the first notch part and the second notch part are filled with solder so that the package for sensing element is fastened to the flat mounting surface of the mounting substrate.

13. A sensing apparatus as claimed in claim 12, wherein the first pad is formed on an inclined surface formed in the inner wall surface of the first notch part of the package body, and
wherein the second pad is formed on an inclined surface formed in the inner wall surface of the second notch part.

14. A sensing apparatus as claimed in claim 9, wherein the mounting substrate includes a relay substrate arranged in a side of one surface of the mounting substrate, and a surface of the relay substrate forms the flat mounting surface of the mounting substrate.

15. A sensing apparatus as claimed in claim 14, wherein the relay substrate includes a silicon substrate or a ceramic substrate.

16. A package for electronic component, comprising:
a package body having substantially a rectangular shape, the package body having a flat cut surface facing and abutted on a flat mounting surface of a mounting substrate, a first side surface intersecting with the flat cut surface, and a first notch part formed at a boundary between the flat cut surface and the first side surface;
an electronic component installed in the package body; and
a first pad electrically connected to the electronic component and formed on an inner wall surface of the first notch part, wherein the inner wall surface of the first notch part has an inclined surface and the first pad is formed on the inclined surface of the first notch part.

17. A package for electronic component as claimed in claim 16, wherein the package body has a second side surface opposed to the first side surface and intersecting the flat cut surface, and a second notch part formed at a boundary between the flat cut surface and the second side surface, and
wherein the package for electronic component further comprises a second pad formed in an inner wall surface of the second notch part.

18. A package for electronic component as claimed in claim 17, wherein the inner wall surface of the second notch part has an inclined surface, and the second pad is formed on the inclined surface of the second notch part.

19. A sensing apparatus comprising:
a mounting substrate having a flat mounting surface and a pad formed on the flat mounting surface; and
a package for sensing element, mounted on the mounting substrate, the package for sensing element including
a package body having a flat cut surface facing and abutted on the flat mounting surface of the mounting substrate, a first side surface intersecting with the flat cut surface, and a first notch part formed at a boundary between the flat cut surface and the first side surface, a sensing element installed in the package body, and a first pad electrically connected to the sensing element and formed on an inner wall surface of the first notch part, the package body having substantially a rectangular shape,
the package body further comprising a second side surface opposed to the first side surface and intersecting the flat cut surface, and a second notch part formed at a boundary between the flat cut surface and the second side surface, and a second pad formed in an inner wall surface of the second notch part,
wherein insides of the first notch part and the second notch part are filled with solder so that the package for sensing element is fastened to the flat mounting surface of the mounting substrate and the first pad formed on the inner wall surface of the first notch part is electrically connected to the pad formed on the flat mounting surface of the mounting substrate.

20. A sensing apparatus as claimed in claim 19, wherein the package for sensing element is mounted on the flat mounting surface of the mounting substrate in a state in which the flat cut surface of the package body abuts perpendicularly on the flat mounting surface of the mounting substrate.

21. A sensing apparatus as claimed in claim 19, wherein the first pad is formed on an inclined surface formed in the inner wall surface of the first notch part of the package body, and
wherein the second pad is formed on an inclined surface formed in the inner wall surface of the second notch part.

22. A sensing apparatus as claimed in claim 19, wherein the mounting substrate includes a relay substrate arranged in a side of one surface of the mounting substrate, and a surface of the relay substrate forms the flat mounting surface of the mounting substrate.

23. A sensing apparatus as claimed in claim 22, wherein the relay substrate includes a silicon substrate or a ceramic substrate.

* * * * *